(12) United States Patent
Kim

(10) Patent No.: US 6,222,384 B1
(45) Date of Patent: Apr. 24, 2001

(54) LEVEL SHIFTER CIRCUIT

(75) Inventor: Kyung-Wol Kim, Seoul (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/166,224

(22) Filed: Oct. 5, 1998

(30) Foreign Application Priority Data

Oct. 10, 1997 (KR) .................................................. 97-51954

(51) Int. Cl.[7] .................... H03K 19/0175; H03K 19/094
(52) U.S. Cl. ........................... 326/68; 326/81; 365/189.11
(58) Field of Search ................................. 326/81, 80, 82, 326/83, 68, 59, 60; 365/189.11

(56) References Cited

U.S. PATENT DOCUMENTS

| | | | |
|---|---|---|---|
| 5,394,374 | 2/1995 | Ishimura et al. | 365/230.06 |
| 5,412,604 | * 5/1995 | Fukuda et al. | 365/189.11 |
| 5,444,408 | * 8/1995 | Merritt | 327/306 |
| 5,521,869 | * 5/1996 | Ishimura et al. | 365/189.01 |
| 5,528,173 | * 6/1996 | Merritt et al. | 326/80 |
| 5,670,905 | * 9/1997 | Keeth et al. | 327/333 |

* cited by examiner

Primary Examiner—Michael Tokar
Assistant Examiner—Daniel D. Chang
(74) Attorney, Agent, or Firm—Fleshner & Kim, LLP

(57) ABSTRACT

A level shifter circuit of the preferred embodiment can be used as a transfer gate driver of a memory circuit such as a DRAM. A pair of cross-coupled transistors receives a first potential. A plurality of transistors are coupled between the pair of cross-coupled transistors and a second potential. An output unit has a pull-down switch for providing an output signal of one of first, second and third potentials and are coupled to the pair of cross-coupled transistor and the plurality of transistors. The third potential has a potential between the first and second potentials.

13 Claims, 5 Drawing Sheets

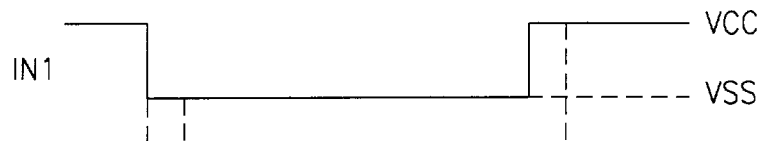
FIG. 4A IN1
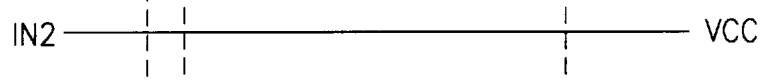
FIG. 4B IN2
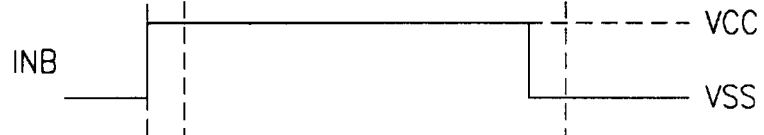
FIG. 4C INB
FIG. 4D A'
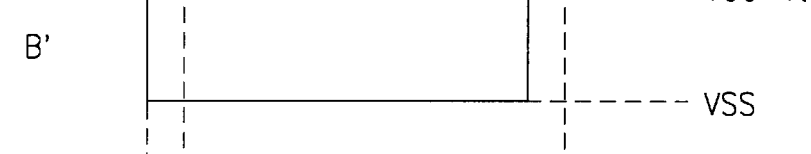
FIG. 4E B'
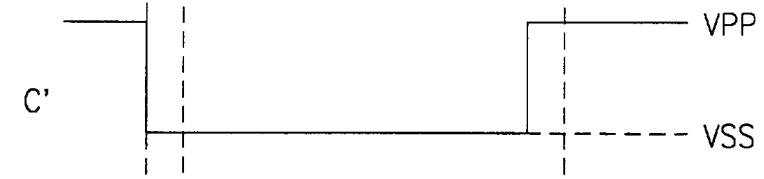
FIG. 4F C'
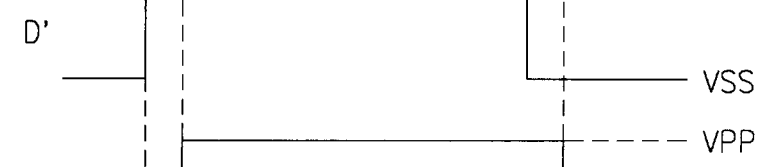
FIG. 4G D'
FIG. 4H OUT FIG. 5A  IN1 ———————————— VCC
FIG. 5B  IN2 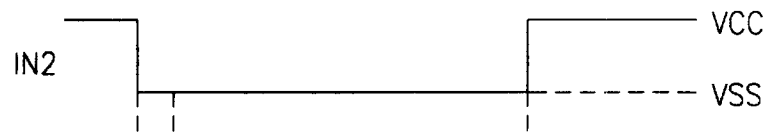 VCC / VSS
FIG. 5C  INB ———————————— VSS
FIG. 5D  A' ———————————— VSS
FIG. 5E  B' ———————————— VCC−Vt
FIG. 5F  C' ———————————— VPP
FIG. 5G  D' ———————————— VSS
FIG. 5H  OUT  VCC / VSS

LEVEL SHIFTER CIRCUIT

BACKGROUND OF THE INVENTION

1. Field of the Invention

The present invention relates to a level shifter circuit, and paticular to a level shifter circuit which is capable of outputting at least three different voltage levels.

2. Background of the Related Art

FIG. 1 illustrates a voltage level translator according to the background art. An inverter INV11 inverts an input signal IN. An NMOS transistor NM11 includes a gate connected for receiving an output signal from the inverter INV11, a source connected to a ground voltage VSS, and a drain connected with a node B. An NMOS transistor NM12 includes a gate connected to receive an externally applied voltage VCC, a source connected to a node B, and a drain connected to a node C. An NMOS transistor NM13 includes a gate connected to receive the externally applied voltage VCC, a source receiving an output signal from the inverter INV11, and a drain connected to a node D. An NMOS transistor NM14 includes a gate receiving a supply voltage VCCp, a source connected to the node D, and the drain connected to the node E. An NMOS transistor NM15 includes a gate receiving the supply voltage VCCp and a source receiving the externally applied voltage.

A PMOS transistor PM11 includes a gate connected to a node E, and a drain connected to the node C, wherein the supply voltage VCCp is supplied to the source and the substrate. A PMOS transistor PM12 includes the gate connected to the node C, and a drain connected to the node E, wherein the supply voltage VCCp is supplied to the source and the substrate, respectively. A PMOS transistor PM13 includes a gate connected to the node C, and a drain connected to a node O, wherein the supply voltage VCCp is supplied to the 5 source and the substrate. A PMOS transistor PM14 includes a gate connected to the node E, a source connected to the drain of the PMOS transistor PM13, and a drain connected to the drain of the NMOS transistor NM15, wherein the supply voltage VCCp is applied to the substrate. An output signal OUT is outputted at the node O.

As shown in FIGS. 2A through 2G, when the input signal IN is triggered from a high level to a low level, the signal transits from the low level to high level at the node A which is an output terminal of the inverter INV11. Therefore, the NMOS transistor NM11 is turned on, and the level of the signal becomes a low level a the node B. Since the NMOS transistor NM12 is always turned on, the level of the signal becomes a low level at the node C.

At the node D, the level of the signal is within a range of VCC-Vt by the NMOS transistor NM13. When the level of the signal becomes a low level at the node C, the PMOS transistor PM12 is activated, such that the signal level at the node E is increased up to the supply voltage VCCp, and the signal level transits to the level of VCCp-Vt, where Vt is a threshold voltage of about 0.7 volts. Therefore, the PMOS transistors PM11 and PM14 are turned off. Since the signal level is a low level at the node C, the PMOS transistor PM13 is turned on, and the signal level at the node O becomes the supply voltage VCCp. Namely, the output signal OUT level becomes the supply voltage VCCp.

Thereafter, when the input signal IN transits from the low level to the high level, the signal level transits from the high level to the low level at the node A. Thereafter, the NMOS transistor NM11 is turned off, and the signal level transits to a low level at the node D. Therefore, the signal level becomes a low level at the node E, and the PMOS transistor PM11 is activated. The signal level at the node C is increased to the supply voltage VCCp, and the PMOS transistors PM12 and PM13 are turned off. Since the signal level is low at the node E, the PMOS transistor PM14 is activated. Further, since the NMOS transistor NM15 is originally turned on, the output signal OUT becomes an externally applied voltage VCC level at the node O.

In order to use the voltage level translator as a transfer gate driver in a memory circuit such as the DRAM, the output signal OUT level is the externally applied voltage VCC or VCCp. However, in the case of the selected block, the output level should be able to transit to the ground voltage VSS. In order to output the ground voltage VSS, additional circuit needs to be provided, which is disadvantageous for reducing the layout area.

SUMMARY OF THE INVENTION

Accordingly, it is an object of the present invention to provide a level shifter circuit which overcomes at least the aforementioned problems.

It is another object of the present invention to provide a three-phase voltage level without additional circuits or components compared to the background art.

It is another object of the present invention to provide an improved level shifter circuit for use as a transfer gate driver.

It is another object of the present invention to reduce power consumption.

It is another object of the present invention to provide a shifter circuit having high operation speed.

It is a further object of the present invention to reduce layout area.

To achieve the above objects, in a whole or in parts, there is provided a level shifter circuit which includes an inverter for inverting an input signal, a first NMOS transistor a gate of which receives an input signal inverted by the inverter, a source of which is connected with a ground voltage VSS, and a drain of which is connected with a node B', a second NMOS transistor a gate of which receives a first input signal, a source of which is connected with a ground voltage VSS, and a drain of which is connected with a node A', a third NMOS transistor a gate of which receives an externally applied voltage VCC, a source of which is connected with the node A', and a drain of which is connected with a node D', a first PMOS transistor a gate of which is connected with the node D', and a drain of which is connected with the node C' wherein a source of which and a substrate receives a raised voltage VPP, a second PMOS transistor a gate of which is connected with the node C', and a drain of which is connected with the node D' wherein a source of which and a substrate receives the raised voltage, a third PMOS transistor a gate of which is connected with the node C', and a drain of which is connected with a node O' wherein a source of which and a substrate receive a raised voltage VPP, a fourth NMOS transistor a gate of which is connected with the node C', a drain of which is connected with the node O', and a source of which receives a second input signal, and a fourth PMOS transistor a gate of which is connected with the node D', a source of which is connected with the node O', and a drain of which receives the second input signal.

The present invention may also be achieved in parts and in a whole by a level shifter comprising: a pair of cross-coupled transistors coupled for receiving a first potential; a plurality of transistors coupled between the pair of cross-coupled transistors and a second potential; and an output unit having a pull-down switch for providing an output signal of one of first, second and third potentials and coupled to the pair of cross-coupled transistor and the plurality of transistors, the third potential having a potential between the first and second potentials.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 4A through 4H are operational signal waveform diagrams of FIG. 3 when a first input voltage is inputted; and FIGS. 5A through 5H are operational signal waveform diagrams of FIG. 3 when a second input voltage is inputted.

DETAILED DESCRIPTION OF PREFERRED EMBODIMENTS

Figure 1:
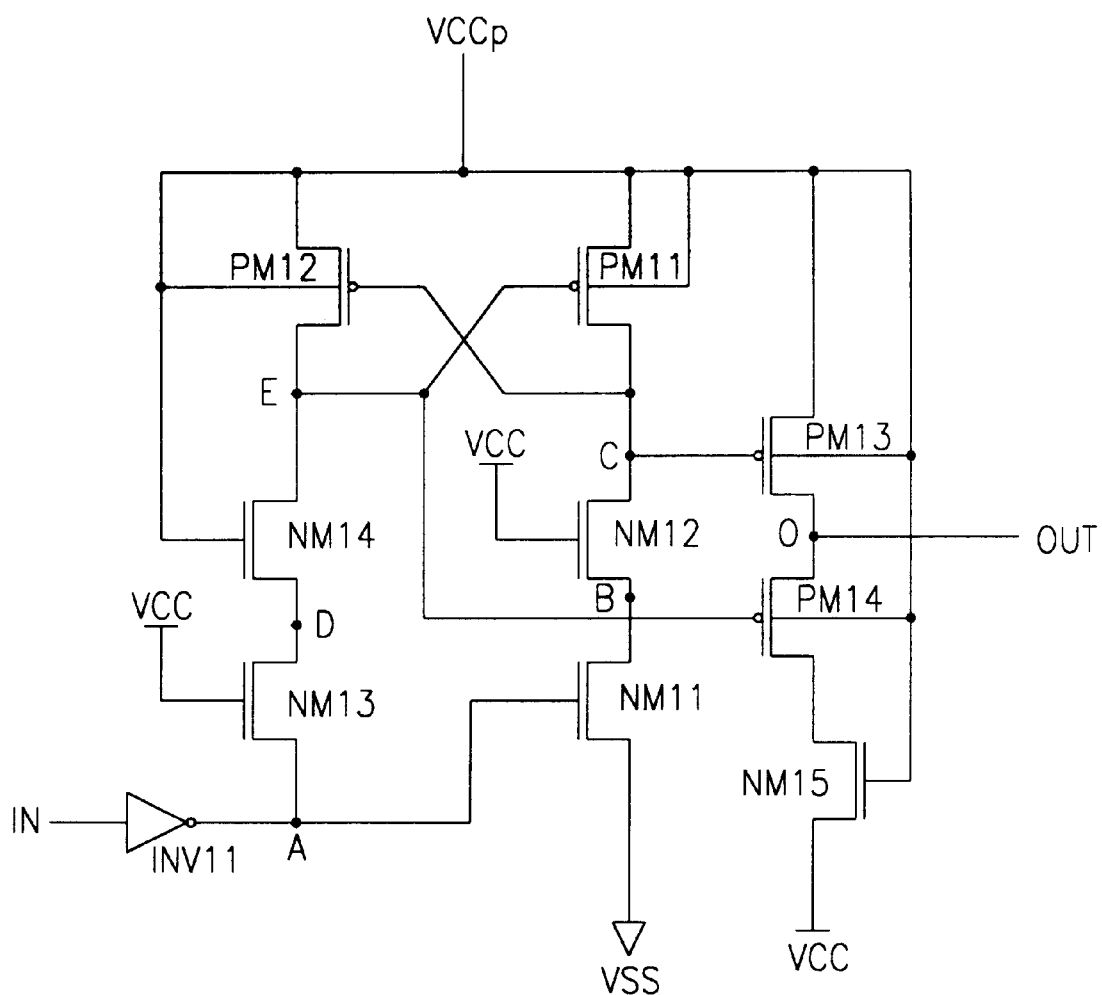
FIG. 1 is a circuit diagram illustrating a voltage level translator of the background art.
Figure 2:
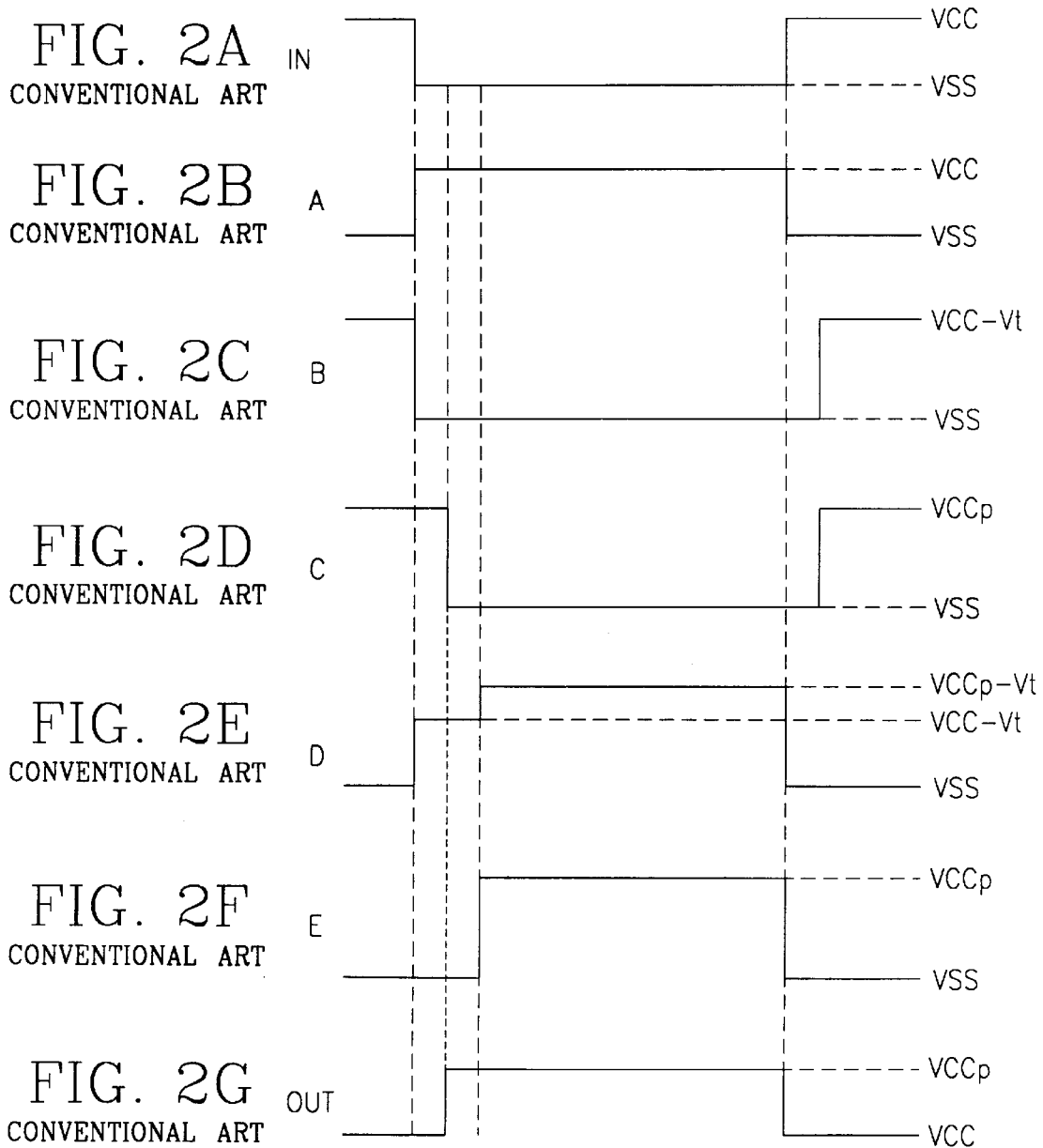
FIGS. 2A through 2G are operational waveform diagrams of FIG. 1.
Figure 3:
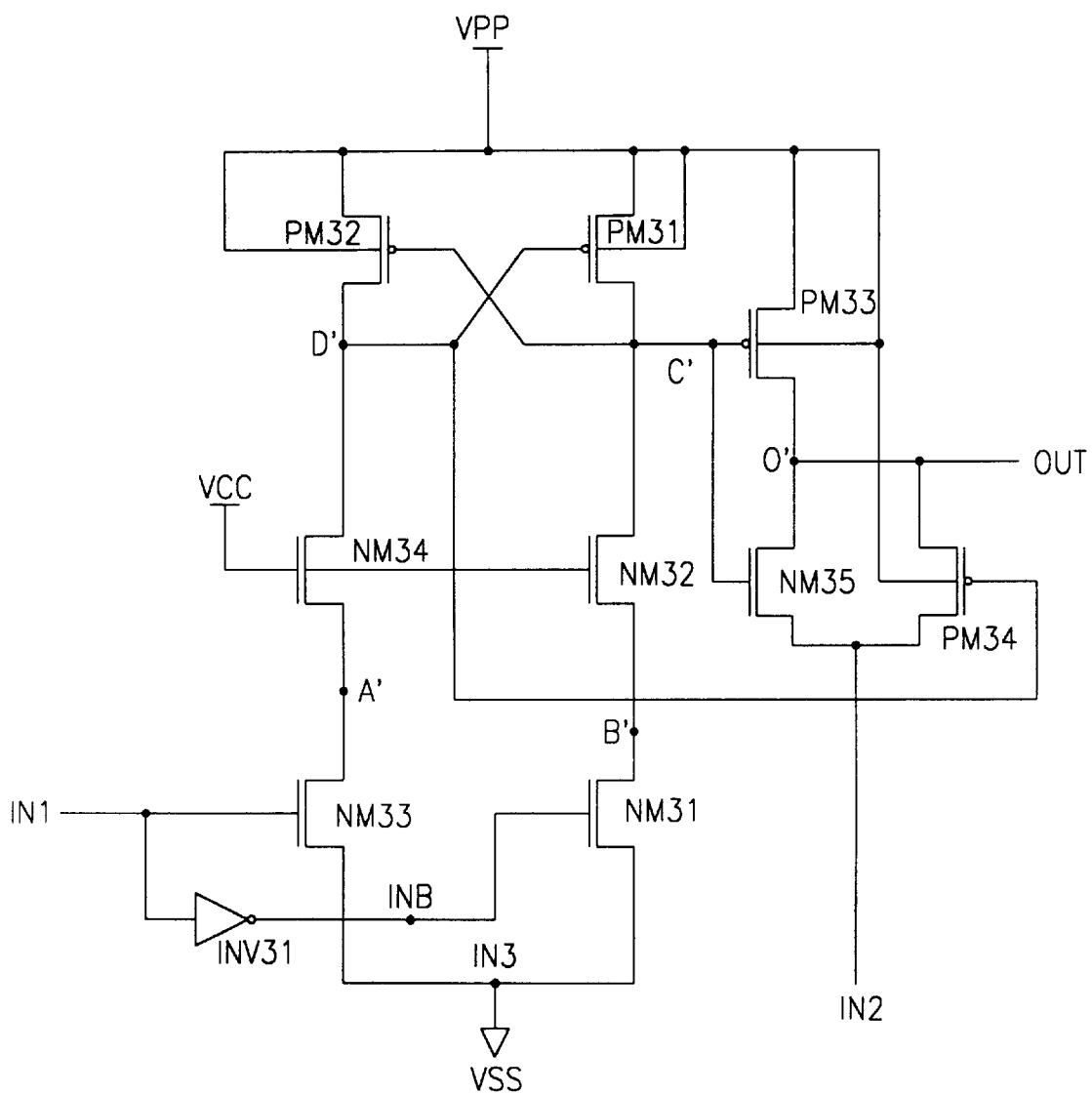
FIG. 3 is a circuit diagram illustrating a level shifter circuit according to a preferred embodiment of the present invention.

FIG. 3 illustrates a level shifter circuit according to a preferred embodiment of the present invention. An inverter INV31 inverts a first input signal IN1. An NMOS transistor NM31 includes a gate receiving an inverted input signal INB from the inverter INV31, a source coupled for receiving a ground voltage VSS, and a drain coupled to a node B'. An NMOS transistor NM32 includes a gate coupled for receiving an externally applied voltage VCC, a source coupled to the node B', and a drain coupled to a node C'. An NMOS transistor NM33 includes a gate coupled for receiving the first input signal IN1, a source coupled for receiving a ground voltage VSS, and a drain coupled to a node A'. An NMOS transistor NM34 includes a gate and substrate coupled for receiving the externally applied voltage VCC, a source coupled to the node A', and a drain coupled to a node D'. An NMOS transistor NM35 includes a gate coupled to the node C', a drain coupled to a node O', and a source coupled for receiving a second input signal IN2.

A PMOS transistor PM31 includes a gate coupled to the node D', and a drain coupled to the node C', wherein a raised voltage VPP is applied to a source and the substrate. A PMOS transistor PM32 includes a gate coupled to the node C', and a drain coupled to the node D', wherein a raised voltage VPP is applied to a source and the substrate. A PMOS transistor PM33 includes a gate coupled to the node C', a drain coupled to a node O', and a source and substrate coupled for receiving the raised voltage VPP. A PMOS transistor PM34 includes a gate coupled to the node D', a source coupled to the node O', and a drain coupled for receiving the second input signal IN2 to provide an output signal OUT at the node O'.

When the level shifter circuit according to the preferred embodiment is incorporated in a memory device, the first input signal IN1 is provided by a selection block signal from one side of a sense amplifier, and the second input signal IN2 is a selection block signal connected to the other side of a sense amplifier. When the sense amplifier is changed from a disabled state to an enabled state, the first input signal IN1 transits from a high level to a low level, and the second input signal IN2 continuously maintains a high level.

As shown in FIGS. 4A through 4H, when the first input signal IN1 transits to a low level, the inverted signal INB transits to a high level, and the NMOS transistor NM33 is turned off while the NMOS transistor NM31 is turned on. Therefore, the signal level at the drain of the NMOS transistor NM31 transits to a low level, and since the NMOS transistor NM32 is always turned on, the signal level at the node C' becomes a low level.

Since the node C' is coupled to level of the gates of the PMOS transistor PM32, the PMOS transistor PM33, and the NMOS trrnsistor NM35, respectively, the PMOS transistor PM32 is turned on, and the signal level at the node D' becomes a raised voltage VPP level. Since the NMOS transistor NM34 is always turned on, the signal level at the node A' becomes VCC-Vt. Further, the PMOS transistor PM33 raises the voltage level at the node O' up to a raised voltage VPP. In addition, the NMOS transistor NM35 is turned off. Since the signal level at the node D' is the raised voltage VPP, the PMOS transistor PM34 is turned off.

When the first input signal IN1 is disabled, e.g., the signal level of the first input signal IN1 transits to a high level, the NMOS transistor NM31 is turned off, and the NMOS transistor NM33 is turned on. Since the NMOS transistor NM34 is internally turned on, the signal level at the node D' transits to a low level. Therefore, the PMOS transistor PM31 is activated, and the signal level at the node C' is increased up to the raised voltage VPP level. The NMOS transistor NM35 is turned on, and the output signal OUT level is decreased to the externally applied voltage VCC level of the second input signal IN2. Since the PMOS transistors PM32 and PM33 are turned off, and the PMOS transistor PM34 is turned on, the PMOS transistor PM34 operates as a CMOS pull-down switch together with the NMOS transistor NM35.

As shown in FIGS. 5A through 5H, when the first input signal IN1 maintains a high level, and the second input signal IN2 level transits from the high level to a low level, the NMOS transistor NM33 is turned on, and the NMOS transistor NM31 is turned off, so that the signal level at the node D' becomes a low level of VSS. Since the PMOS transistors PM31 and PM34 are activated, the second input signal IN2 is outputted as an output signal OUT at the node O'. Because the signal level at the node C' is a high level during a memory operation, the PMOS transistors PM32 and PM33 remain turned-off.

The NMOS transistors NM34 and NM32 are used to reduce the operational loads of the PMOS transistors PM31 and PM32 and originally remain turned-off when the nodes C' and D' at which the signal levels are at the raised voltage VPP level and the ground voltage VSS, respectively, by the NMOS transistor NM33 or the NMOS transistor NM31. At this time, the nodes A' and B' have signal levels of the ground voltage VSS and VCC-Vt, respectively. The NMOS transistor NM35 and the PMOS transistor PM34 output the output signal OUT of the CMOS switch, respectively, regardless of the levels of the second input signal IN2.

The preferred embodiment is readily applicable as a transfer gate driver connecting a cell array and a sense amplifier in the DRAM having a common sense amplifier structure and a bidirectional global bit line structure is used. A plurality of cell arrays are provided between two sense amplifiers, and a transfer gate driver is connected between the arrays. The transfer gate driver maintains an external voltage VCC level when the memory circuit is disabled. When the memory circuit is driven, the signal level at the selected transfer gate driver becomes a raised voltage VPP level, and the signal level at the non-selected transfer gate driver becomes a ground voltage VSS level.

In addition, since the pull-down transistor is used, it is possible to reduce power consumption, and the circuit according to the preferred embodiment is operated at a high speed. Furthermore, since it is possible to generate three different voltage levels VCC, VPP and VSS using one circuit, the level shifter circuit according to the preferred embodiment may be used as a voltage level translator. The layout area of the circuit is reduced compared to the background art.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A level shifter circuit, comprising:
   an inverter for inverting an input signal;
   a first transistor having a gate to receive an input signal inverted by the inverter, a source coupled to a ground voltage, and a drain coupled to a first node;
   a second transistor having a gate to receive a first input signal, a source coupled to a ground voltage, and a drain coupled to a second node;
   a third transistor having a gate to receive an externally applied voltage, a source coupled to the second node, and a drain coupled to a third node;
   a fourth transistor having a gate coupled to the third node, and a drain coupled to a fourth node, wherein a source and a substrate receives a raised voltage;
   a fifth transistor having a gate coupled to the fourth node, and a drain coupled to the third node, wherein a source and a substrate receives the raised voltage;
   a sixth transistor having a gate coupled to the fourth node, and a drain coupled to a fifth node wherein a source and a substrate receive the raised voltage;
   a seventh transistor having a gate coupled to the fourth node, a drain coupled to the fifth node, and a source for receiving a second input signal;
   an eighth transistor having a gate coupled to the third node, a source coupled to the fifth node, and a drain coupled to receive the second input signal; and
   a ninth transistor having a gate to receive an externally applied voltage, a source coupled to the first node, and a drain coupled to a fourth node.

2. The level shifter circuit of claim 1, wherein the input signal is directly outputted irrespective of the level of the second input signal by using a CMOS pull-down switch.

3. The level shifter circuit of claim 1, wherein one of the ground voltage, raised voltage and externally applied voltage is provided as an output signal at the fifth node.

4. The level shifter circuit of claim 1, wherein said first, second, third and seventh transistors are NMOS transistors, and said fourth, fifth,, sixth and eighth transistors are PMOS transistors.

5. A level shifter comprising:
   a pair of cross-coupled transistors coupled for receiving a first potential;
   a plurality of transistors coupled between said pair of cross-coupled transistors and a second potential; and
   an output unit having a pull-down switch for providing an output signal of one of first, second and third potentials and coupled to said pair of cross-coupled transistor and said plurality of transistors, the third potential having a potential between the first and second potentials, wherein said plurality of transistors includes a first transistor coupled between the second potential and a first node, a second transistor coupled between the second potential and a second node, a third transistor coupled between the cross-coupled transistors and the first node, and a fourth transistor coupled between the cross-coupled transistors and the second node.

6. The level shifter of claim 5, wherein each of said first, second, third and fourth transistors includes first and second electrodes and a control electrode, the first and second electrodes of said first and third transistors, respectively, being coupled to the first node, and first and second electrodes of said second and fourth transistors, respectively, being coupled to the second node, and the control electrodes of first and second transistors being coupled for receiving a first input signal and an inverted first input signal and control electrodes of said third and fourth transistors being coupled for receiving the third potential.

7. The level shifter of claim 6, wherein said first, second, third and fourth transistors are NMOS transistors.

8. The level shifter of claim 5, wherein said cross-coupled transistor comprises:
   a fifth transistor having first and second electrodes and a control electrode;
   a sixth transistor having first and second electrodes and a control electrode, the first electrode and a substrate of said fifth and sixth transistors being coupled to receive the first potential, the control electrode of said fifth transistor being coupled to the second electrode of the sixth transistor and the control electrode of said sixth transistor being coupled to the second electrode of the fifth transistor, wherein the second electrode of said fifth and sixth transistors is coupled to corresponding transistor of said plurality of transistors.

9. The level shifter of claim 8, wherein fifth and sixth transistors are PMOS transistors.

10. The level shifter of claim 5, wherein said output unit further comprises a fifth transistor coupled between the first potential and said pull-down switch.

11. The level shifter of claim 10, wherein said pull-down switch comprises sixth and seventh transistors, each of said fifth, sixth and seventh transistors having first and second electrodes and a control electrode, the control electrode of fifth, sixth and seventh transistors being coupled to said cross-coupled transistors and the plurality of transistors, the first electrodes of the fifth transistor and substrate of fifth and seventh transistors being coupled to the first potential, the second electrode of said fifth and sixth transistors and the first electrode of said seventh transistor being coupled to an output node for providing the output signal, and the first electrode of the sixth transistor and the second electrode of the seventh transistor being coupled to receive a second input signal.

12. The level shifter of claim 11, wherein said fifth and seventh transistors are PMOS transistors and said sixth transistor is an NMOS transistor.

13. A level shifter comprising:
a pair of cross-coupled transistors coupled for receiving a first potential;
a plurality of transistors coupled between said pair of cross-coupled transistors and a second potential; and
an output unit having a pull-down switch for providing an output signal of one of first, second and third potentials and coupled to said pair of cross-coupled transistor and said plurality of transistors, the third potential having a potential between the first and second potentials, wherein said output unit further includes a first transistor coupled between the first potential and said pull-down switch, second and third transistors, each of said first, second and third transistors having first and second electrodes and a control electrode, the control electrode of first, second and third transistors being coupled to said cross-coupled transistors and the plurality of transistors, the first electrodes of the first transistor and substrate of first and third transistors being coupled to the first potential, the second electrode of said first and second transistors and the first electrode of said third transistor being coupled to an output node for providing the output signal, and the first electrode of the second transistor and the second electrode of the third transistor being coupled to receive a second input signal.

* * * * *